United States Patent
Zhu et al.

(10) Patent No.: US 6,856,210 B2
(45) Date of Patent: Feb. 15, 2005

(54) HIGH-FREQUENCY MULTILAYER CIRCUIT SUBSTRATE

(75) Inventors: Yu Zhu, Pine Brook, NJ (US); Eiji Suematsu, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/842,768

(22) Filed: Apr. 27, 2001

(65) Prior Publication Data

US 2001/0054939 A1 Dec. 27, 2001

(30) Foreign Application Priority Data

Apr. 27, 2000 (JP) ......................................... 2000-127398

(51) Int. Cl.[7] .............................. H03H 7/38; H01P 3/08
(52) U.S. Cl. ........................................ 333/33; 333/246
(58) Field of Search ................................ 333/246, 263, 333/33; 257/728

(56) References Cited

U.S. PATENT DOCUMENTS

| | | | | |
|---|---|---|---|---|
| 3,660,784 A | * | 5/1972 | Scharfman | 333/22 F |
| 4,418,429 A | * | 11/1983 | Roberts | 455/327 |
| 4,494,083 A | * | 1/1985 | Josefsson et al. | 333/33 |
| 4,623,848 A | * | 11/1986 | Saka et al. | 330/286 |
| 4,875,087 A | * | 10/1989 | Miyauchi et al. | 357/71 |
| 5,387,888 A | * | 2/1995 | Eda et al. | 333/247 |
| 5,525,953 A | * | 6/1996 | Okada et al. | 333/204 |
| 5,701,128 A | * | 12/1997 | Okada et al. | 343/700 MS |
| 5,717,249 A | * | 2/1998 | Yoshikawa et al. | 257/728 |
| 6,175,287 B1 | * | 1/2001 | Lampen et al. | 333/247 |
| 6,204,448 B1 | * | 3/2001 | Garland et al. | 174/52.3 |

FOREIGN PATENT DOCUMENTS

JP A11150371 6/1999

OTHER PUBLICATIONS

Hayt, Jr. ,William Engineering Electromagnetics, 1981, McGraw–Hill Book Company, 4th edition, pp. 454–455.*

* cited by examiner

*Primary Examiner*—Stephen E. Jones
(74) *Attorney, Agent, or Firm*—Birch, Stewart, Kolasch & Birch, LLP.

(57) ABSTRACT

A high-frequency multilayer circuit substrate having a plurality of circuit layers includes a via hole for connection between the circuit layers, a metal pad, an impedance matching transmission line, rectangular stubs and a signal transmission line. A via hole connecting portion is constructed of the via hole, the rectangular stubs and the impedance matching transmission line. A characteristic impedance of the via hole connecting portion is matched to a characteristic impedance of the signal transmission line by adjusting widths and lengths of the impedance matching transmission line and the rectangular stubs. Thereby, the reflection of the signal wave in the via hole connecting portion is reduced to decrease a transmission loss.

6 Claims, 10 Drawing Sheets

HIGH-FREQUENCY MULTILAYER CIRCUIT SUBSTRATE

BACKGROUND OF THE INVENTION

The present invention relates to a high-frequency multilayer circuit substrate used in a microwave band and employing a via hole for connection between circuit layers.

There has conventionally been a high-frequency multilayer circuit substrate, in which transmission lines are connected by way of a via hole provided for the improvement in performance of a high-frequency circuit and for high-density mounting. As reduction in size and increase in transmission signal frequency of this multilayer circuit substrate have been needed, a transmission loss due to signal wave reflection in the transmission lines and a via hole connecting portion has become a more serious trouble. In contrast to this, according to Japanese Patent Laid-Open Publication No. HEI 11-15037, characteristic impedance matching of the via hole connecting portion is achieved by providing a plate-shaped ground conductor of a specified width with a specified interval provided apart from a transmission line via hole or providing a columnar ground conductor with a specified interval provided apart from the transmission line via hole.

The above-mentioned high-frequency multilayer circuit substrate is required to control the characteristic impedance of the via hole connecting portion by adjusting the interval between the ground conductor and the via hole when providing characteristic impedance matching of the via hole connecting portion. However, in terms of a substrate manufacturing process, the circuit substrate manufacturing requires finer precision as the interval between the via hole that penetrates the substrate and the ground conductor becomes smaller in the case of either the plated-shaped ground conductor or the columnar ground conductor, disadvantageously causing a manufacturing cost increase.

SUMMARY OF THE INVENTION

Accordingly, the present invention has an object of providing a high-frequency multilayer circuit substrate capable of executing low-reflection low-loss inter-circuit-layer transmission with a simple structure and reducing the manufacturing cost.

In order to achieve the aforementioned object, the present invention provides a high-frequency multilayer circuit substrate comprising: a plurality of circuit layers; a via hole penetrating the plurality of circuit layers to be connected to each other; a plane impedance matching circuit connected to the via hole; and a signal transmission line connected to the plane impedance matching circuit, wherein a characteristic impedance of a via hole connecting portion formed by the via hole and the plane impedance matching circuit is matched to a characteristic impedance of the signal transmission line.

According to the high-frequency multilayer circuit substrate having the above-mentioned construction, by adjusting the characteristic impedance of the via hole connecting portion by means of the plane impedance matching circuit, the characteristic impedance of the via hole connecting portion is matched to the characteristic impedance of the signal transmission line of the circuit layer connected by way of the via hole. This arrangement leads to low-reflection low-loss inter-circuit-layer transmission in a microwave band, particularly in the millimeter wave region, with a simple structure at low cost.

In an embodiment of the present invention, the plane impedance matching circuit is formed by an impedance matching transmission line, one end of which is connected to the via hole and other end of which is connected to the signal transmission line.

In an embodiment of the present invention, the characteristic impedance of the via hole connecting portion is matched to the characteristic impedance of the signal transmission line by adjusting a width and a length of the impedance matching transmission line.

In an embodiment of the present invention, the plane impedance matching circuit is formed by the impedance matching transmission line and stubs which are connected to both sides of the impedance matching transmission line at the other end thereof.

In an embodiment of the present invention, the characteristic impedance of the via hole connecting portion is matched to the characteristic impedance of the signal transmission line by adjusting the width and length of the impedance matching transmission line and a width and a length of each of the stubs.

In an embodiment of the present invention, the plane impedance matching circuit is formed by a plurality of impedance matching transmission lines having at least two different widths and connected in series to the via hole and the signal transmission line.

In an embodiment of the present invention, the characteristic impedance of the via hole connecting portion is matched to the characteristic impedance of the signal transmission line by adjusting widths and lengths of the impedance matching transmission lines.

According to the high-frequency multilayer circuit substrate of the above-mentioned embodiments, the characteristic impedance of the via hole connecting portion is easily matched to the characteristic impedance of the signal transmission line by adjusting width and length of the impedance matching transmission lines and/or the stubs.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
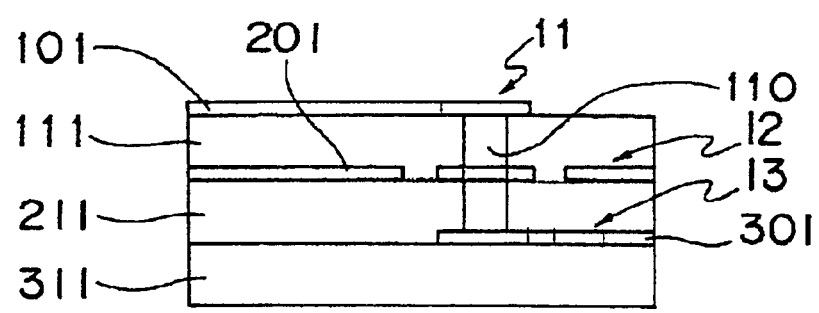
FIG. 1 is a schematic view showing a cross-section of a high-frequency multilayer circuit substrate according to a first embodiment of the present invention.

Taking high-frequency characteristics of a via hole into consideration, the present inventor discovered a method for eliminating signal wave reflection in the via hole connecting portion and a transmission loss due to the reflection by regarding the via hole as a circuit component having a characteristic impedance different from that of a signal transmission line and by providing an adjustable impedance matching planar circuit between the via hole and the signal transmission line.

A high-frequency multilayer circuit substrate of the present invention will be described in detail below on the basis of embodiments shown in the drawings.

FIG. 1 is a schematic view showing a cross-section of a high-frequency multilayer circuit substrate according to a first embodiment of the present invention. Dielectric substrates 111, 211, 311 and a via hole 110 are shown in FIG. 1. Each of the dielectric substrates 111, 211, 311 has a thickness of 150 μm and a relative dielectric constant of 8.7. The via hole 110 has a diameter of 100 μm and penetrates the dielectric substrates 111, 211. A first circuit layer 11 is formed on a surface of the dielectric substrate 111, and a second circuit layer 12 is formed between the dielectric substrate 111 and the dielectric substrate 211. A third circuit layer 13 is formed between the dielectric substrate 211 and the dielectric substrate 311.

Figure 2:
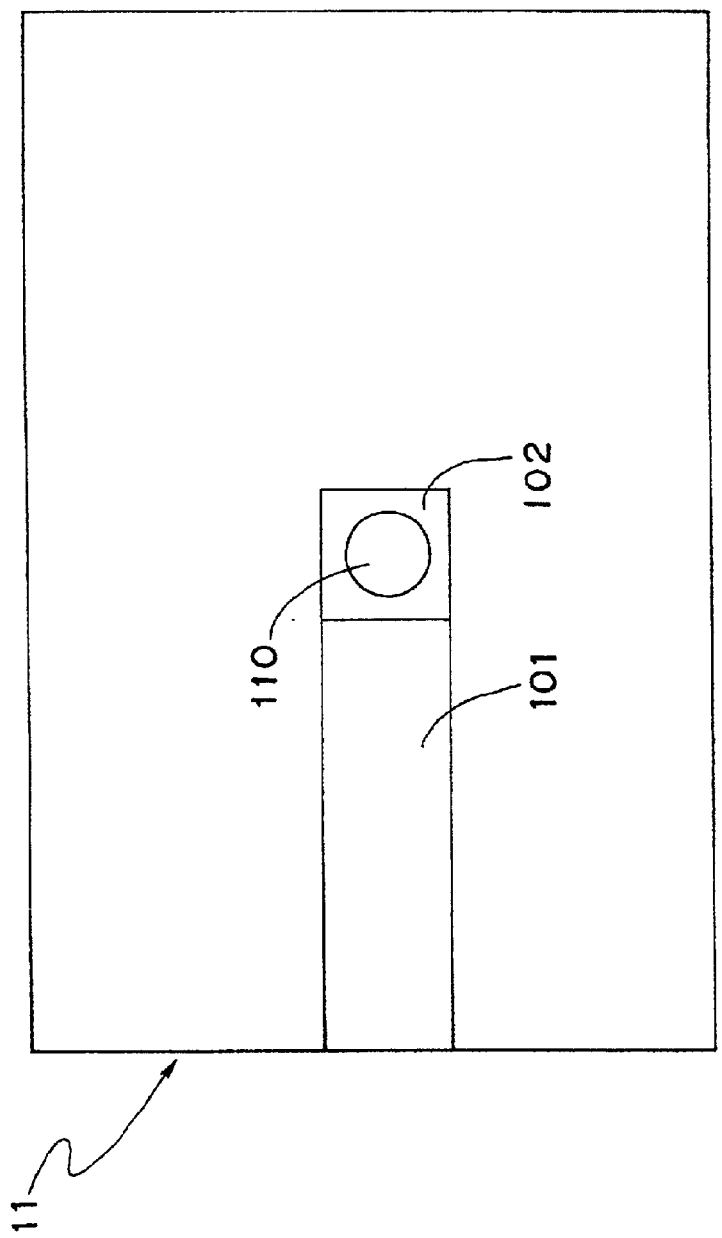
FIG. 2 is a plan view showing a first circuit layer of the high-frequency multilayer circuit substrate according to the first embodiment.
Figure 3:
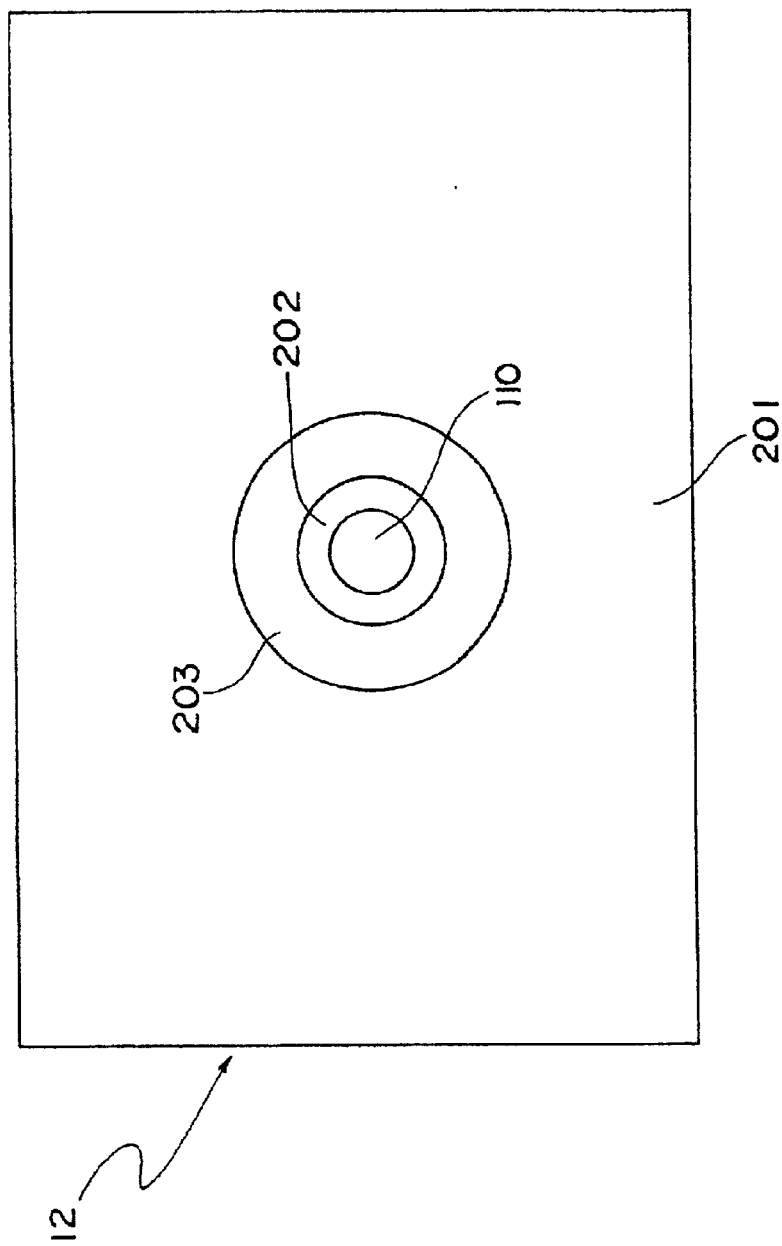
FIG. 3 is a plan view showing a second circuit layer of the high-frequency multilayer circuit substrate according to the first embodiment.
Figure 4:
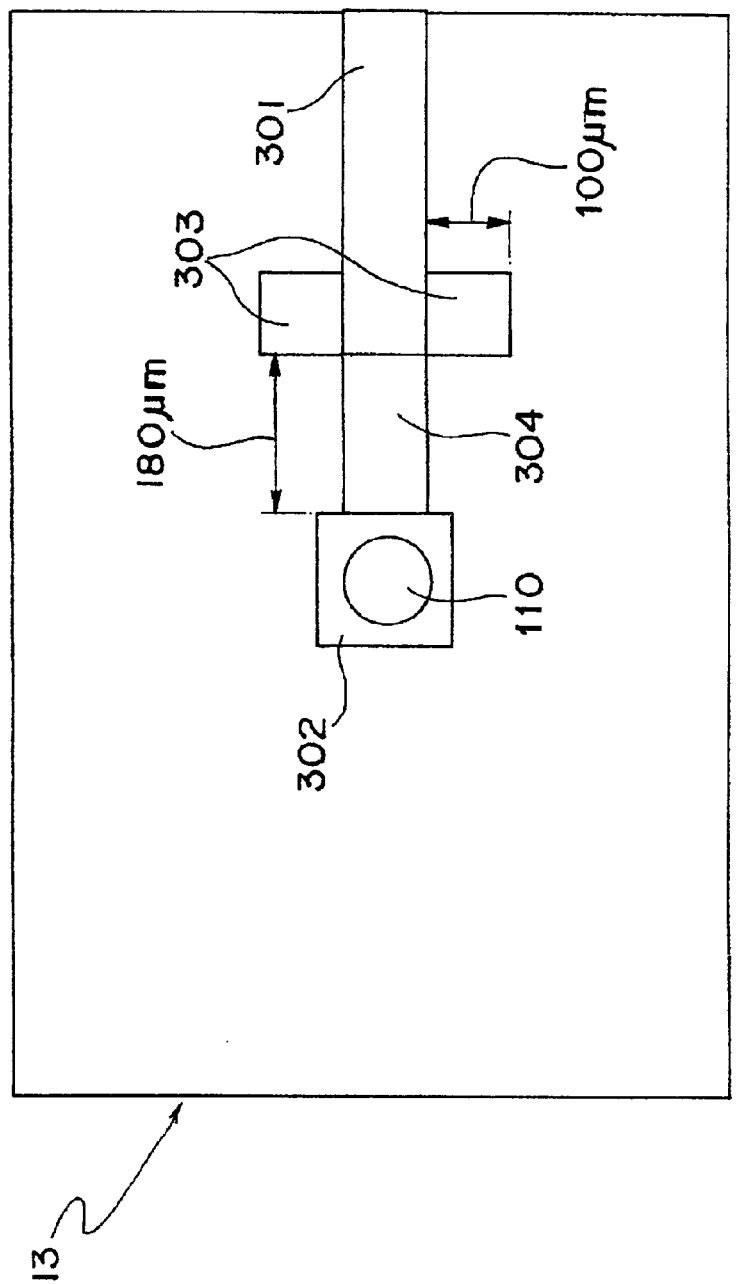
FIG. 4 is a plan view showing a third circuit layer of the high-frequency multilayer circuit substrate according to the first embodiment.

FIG. 2, FIG. 3 and FIG. 4 show plan views of the first circuit layer 11, the second circuit layer 12 and the third circuit layer 13, respectively.

As shown in FIG. 2, the first circuit layer 11 is provided with a microstrip line 101 and a via hole metal pad 102. The microstrip line 101 has a width of 160 μm and serves as a signal transmission line. The via hole metal pad 102 is 160 μm in length and width, and connects one end of the microstrip line 101 with the via hole 110.

As shown in FIG. 3, the second circuit layer 12 is provided with a ground conductor 201 and a via hole metal pad 202. A clearance 203 is provided between the ground conductor 201 and the via hole metal pad 202, and has an outer diameter of 500 μm and an inner diameter of 150 μm. The via hole metal pad 202 has an outer diameter of 150 μm and an inner diameter of 100 μm so as to be next to the clearance 203 and the via hole 110.

As shown in FIG. 4, the third circuit layer 13 is provided with a microstrip line 301, a via hole metal pad 302, rectangular stubs 303 and an impedance matching microstrip line 304. The microstrip line 301 has a width of 100 μm and serves as a signal transmission line. The via hole metal pad 302 is 160 μm in length and width, and connects one end of the impedance matching microstrip line 304 with the via hole 110. The rectangular stub 303 has a width of 100 μm. The impedance matching microstrip line 304 has a width of 100 μm. One end of the impedance matching microstrip line 304 is connected to the via hole metal pad 302, and the other end of the impedance matching microstrip line 304 is connected to one end of the microstrip line 301. The rectangular stubs 303 are connected to both sides of the impedance matching microstrip line 304 at the other end of the impedance matching microstrip line 304. That is, both of the rectangular stubs 303 respectively extends on both sides of the impedance matching microstrip line 304 outwardly in a direction perpendicular to the lengthwise direction thereof.

A planar impedance matching circuit is constructed of the rectangular stubs 303 and the impedance matching microstrip line 304. A via hole connecting portion is constructed of the via hole 110, the via hole metal pad 102, the via hole metal pad 202, the via hole metal pad 302, the rectangular stubs 303 and the impedance matching microstrip line 304.

In the high-frequency multilayer circuit substrate having the above-mentioned construction, the characteristic impedance of the via hole connecting portion is controlled by adjusting lengths of the impedance matching microstrip line 304 and the rectangular stubs 303 (shown in FIG. 4) so that the characteristic impedance of the via hole connecting portion is matched with the characteristic impedance of the transmission line at the wavelength of a signal to be transmitted. Thereby, reflection of the signal wave from the via hole connecting portion is reduced to decrease the transmission loss.

The electromagnetic field distribution of the physical structure shown in FIG. 1 is calculated by using the boundary element method so as to obtain an S parameter which represents the high-frequency characteristic of the physical structure. By using this calculation method, the length of the impedance matching microstrip line 304 and the length of the rectangular stubs 303 are optimized so that the reflection loss and the transmission loss are minimized.

Figure 5:
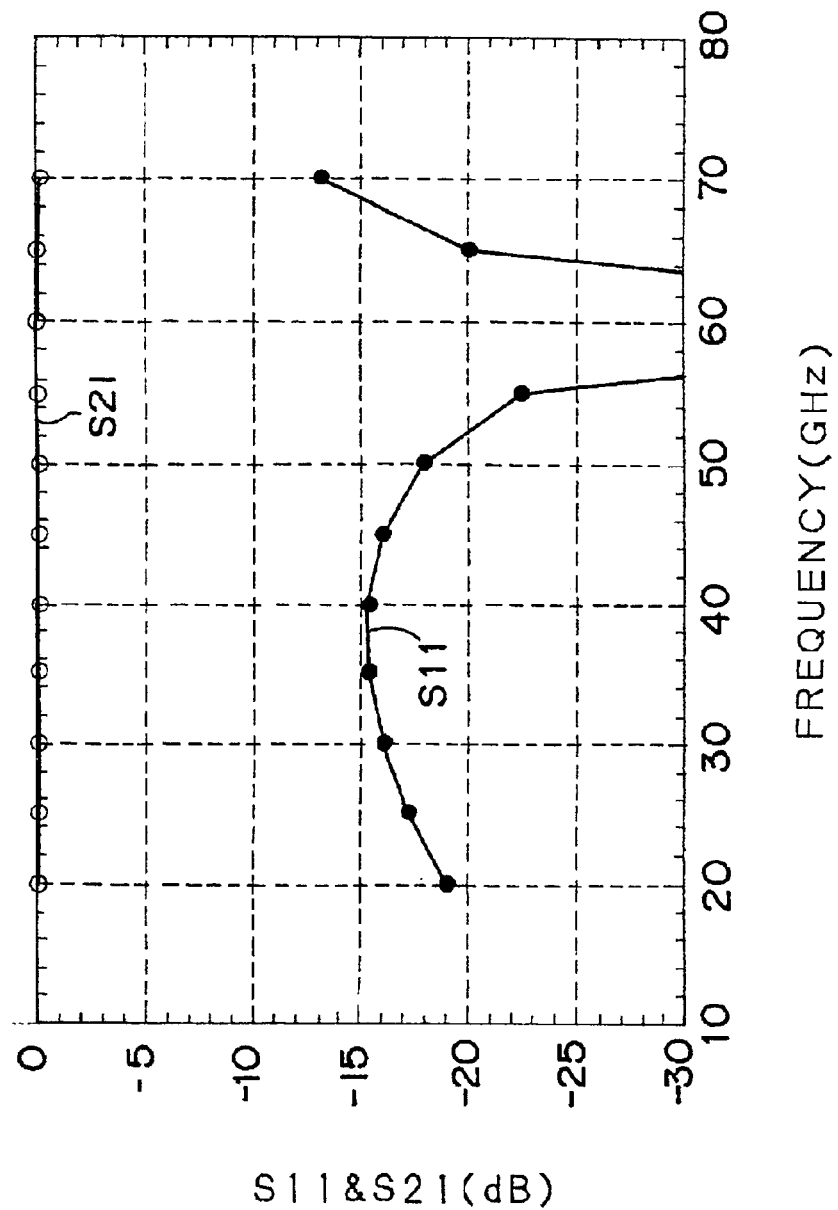
FIG. 5 is a graph of an inter-circuit-layer transmission characteristic of the high-frequency multilayer circuit substrate according to the first embodiment.
Figure 6:
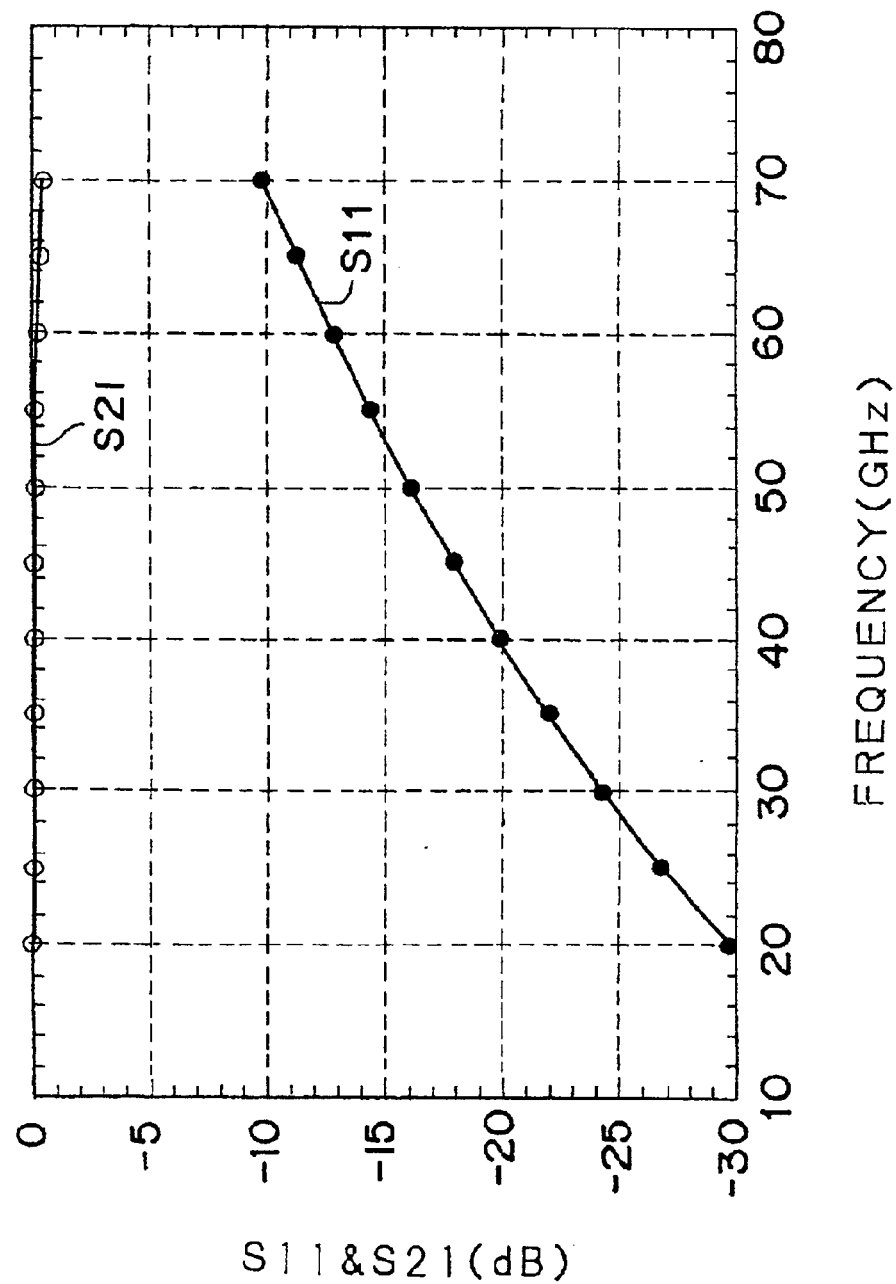
FIG. 6 is a graph of an inter-circuit-layer transmission characteristic of a high-frequency multilayer circuit substrate with a via hole which substrate has no plane impedance matching circuit.

FIG. 5 shows the decibel value of reflection loss (S11) and the decibel value of transmission loss (S21) in the case where the length of the impedance matching microstrip line 304 (shown in FIG. 4) is 180 μm and the length of the rectangular stubs 303 (shown in FIG. 4) is 100 μm. For the sake of comparison, FIG. 6 shows a transmission characteristic in the case where no planar impedance matching circuit is provided. In FIG. 5 and FIG. 6, the horizontal axis represents frequency, while the vertical axis represents the reflection loss and the transmission loss.

As is apparent from FIG. 5 and FIG. 6, according to this high-frequency multilayer circuit substrate, the stubs having a specified length are provided in the specified positions of the transmission line. Thereby, low-loss inter-circuit-layer transmission can be achieved by reduction in reflection at a desired frequency with a simple construction at low cost.

Although open stubs are employed in the aforementioned first embodiment, it is also possible to control the characteristic impedance of the via hole connecting portion with short stubs by adjusting the length of the impedance matching microstrip line 304.

Furthermore, although the stubs are provided for one of transmission lines connected by way of the via hole in the aforementioned first embodiment, it is also possible to provide stubs for the plurality of transmission lines.

Figure 7:
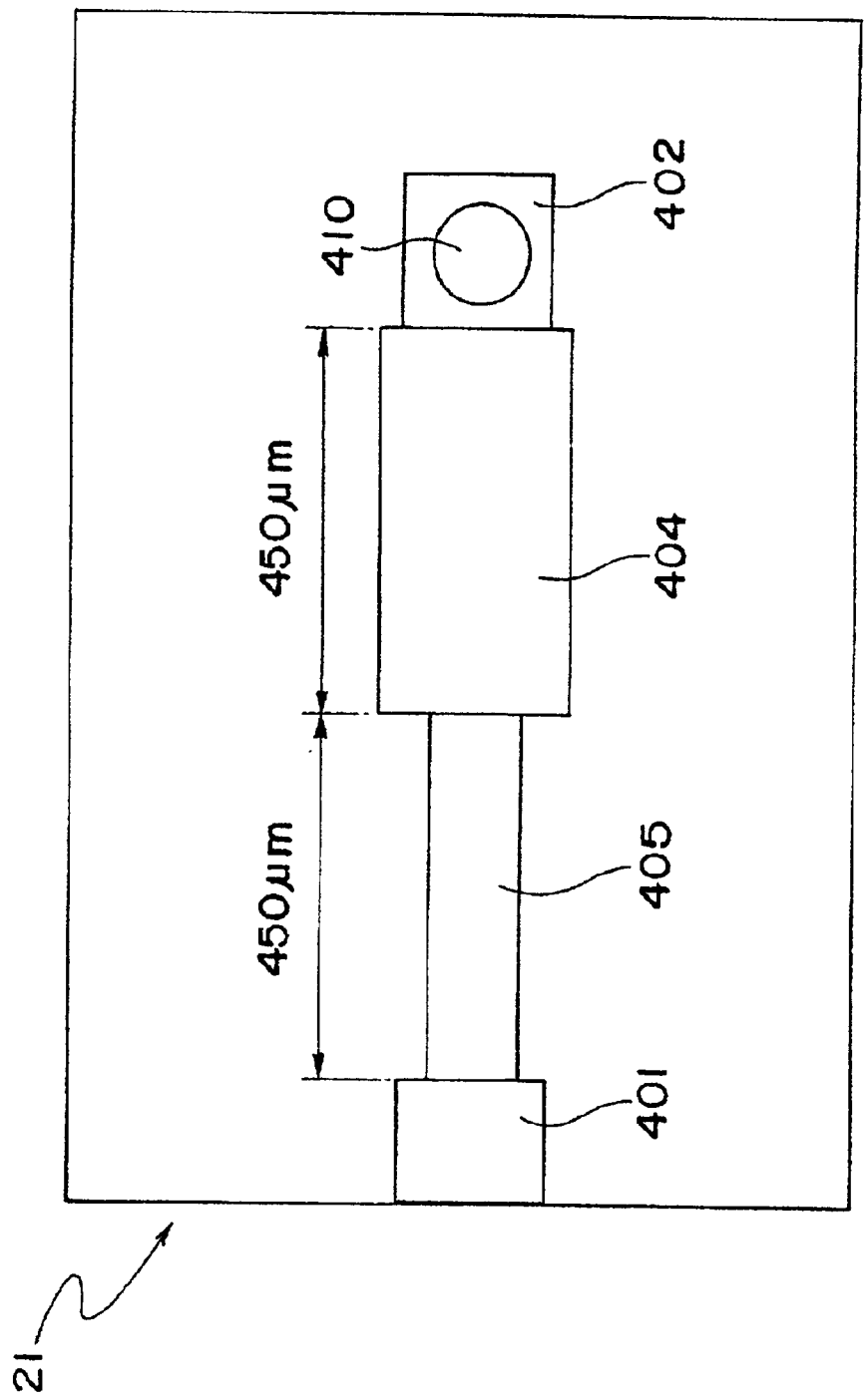
FIG. 7 is a plan view showing a first circuit layer of a high-frequency multilayer circuit substrate according to a second embodiment of the present invention.
Figure 8:
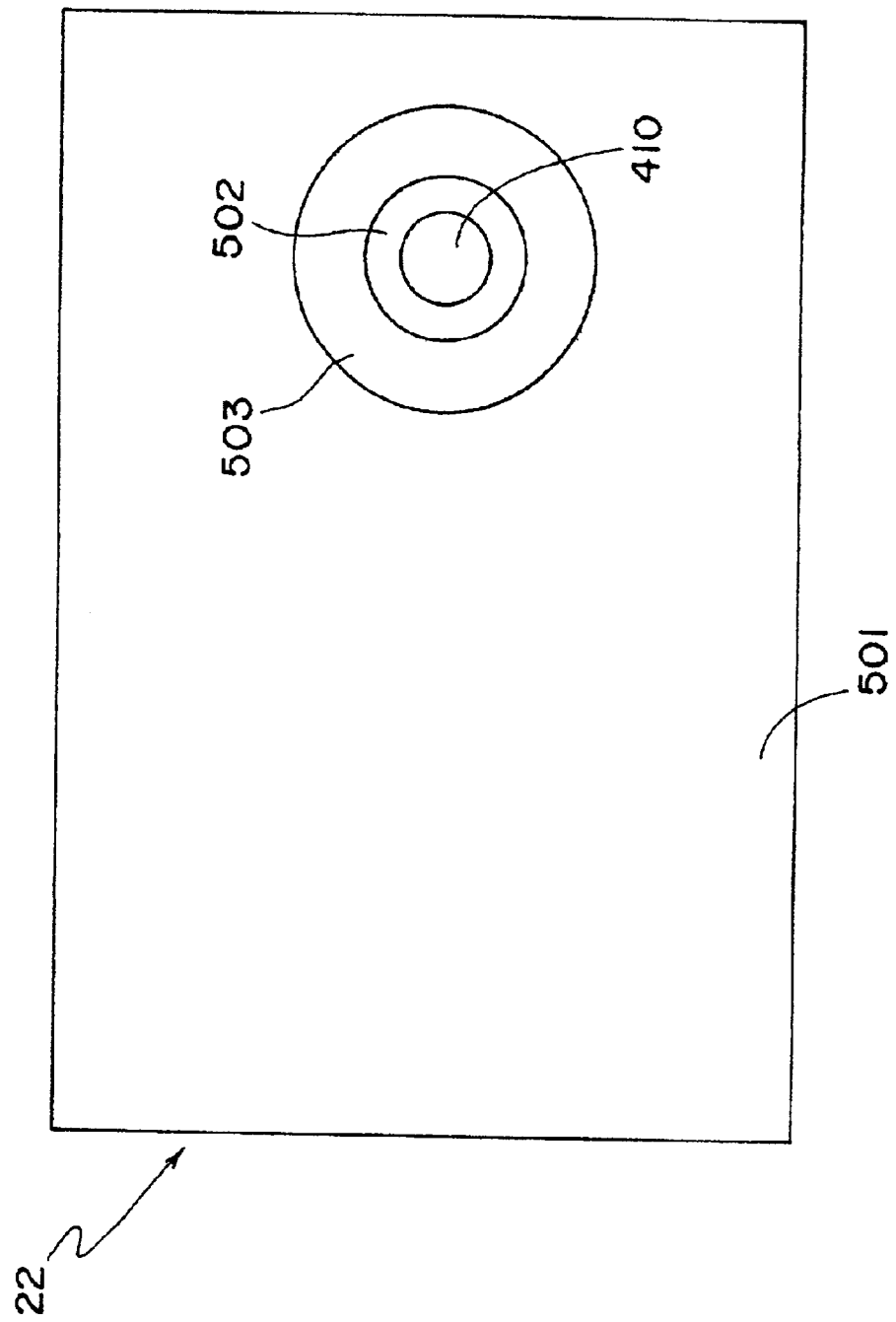
FIG. 8 is a plan view showing a second circuit layer of the high-frequency multilayer circuit substrate according to the second embodiment.
Figure 9:
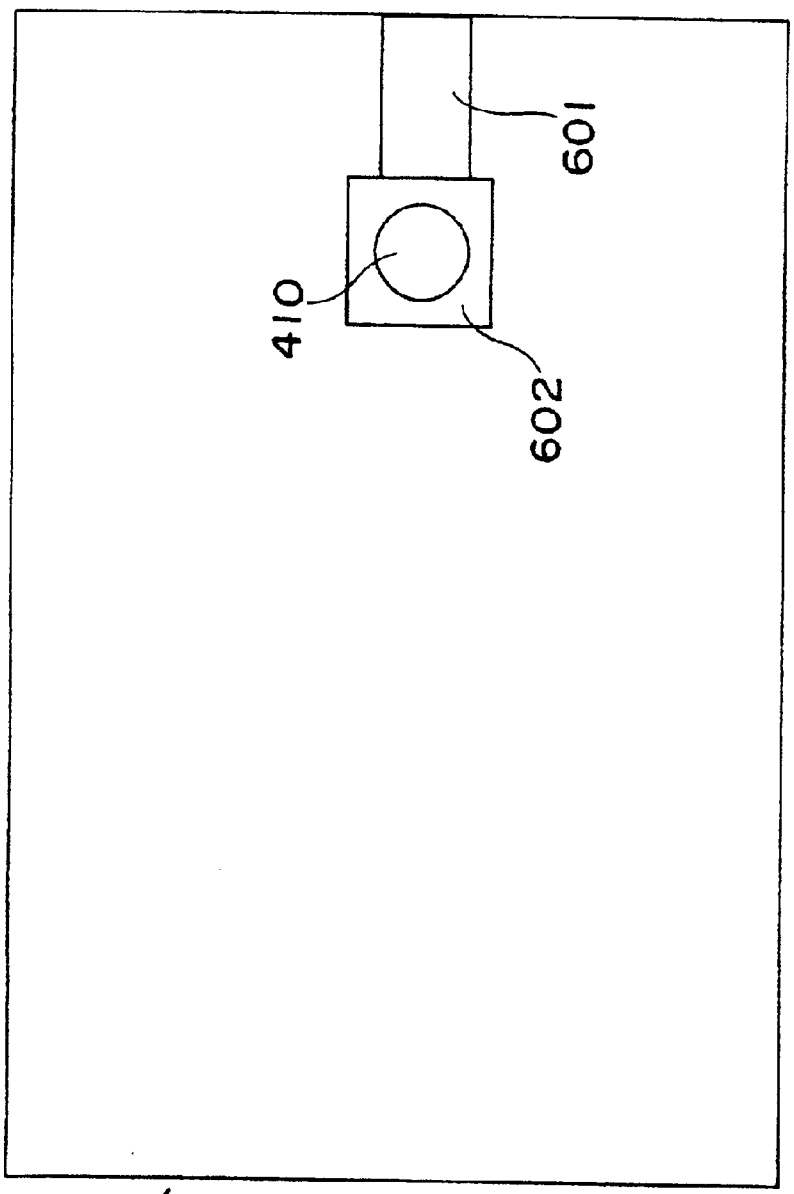
FIG. 9 is a plan view showing a third circuit layer of the high-frequency multilayer circuit substrate according to the second embodiment.

FIG. 7, FIG. 8 and FIG. 9 show plan views of a first circuit layer 21, a second circuit layer 22 and a third circuit layer 23, respectively, of a high-frequency multilayer circuit substrate according to the second embodiment of the present invention. The high-frequency multilayer circuit substrate of this second embodiment has a multilayer structure of three dielectric substrates with a via hole 410 (not shown). Each of the dielectric substrates has a thickness of 150 μm and a relative dielectric constant of 8.7. The via hole 410 has a diameter of 100 μm and penetrates the upper two dielectric substrates, similarly to the high-frequency multilayer circuit substrate of the first embodiment shown in FIG. 1.

As shown in FIG. 7, the first circuit layer 21 is provided with a microstrip line 401, a via hole metal pad 402, an impedance matching microstrip line 404 and an impedance matching microstrip line 405. The microstrip line 401 has a width of 160 μm and serves as a signal transmission use line. The via hole metal pad 402 is 160 μm in length and width and is provided around the via hole 410. The impedance matching microstrip line 404 has a width of 180 μm and the impedance matching microstrip line 405 has a width of 100 μm. The microstrip line 401 is connected with the via hole metal pad 402 through the impedance matching microstrip line 404 and the impedance matching microstrip line 405.

As shown in FIG. 8, the second circuit layer 22 is provided with a ground conductor 501 and a via hole metal pad 502. The via hole metal pad 502 is provided around the via hole 410 and has an outer diameter of 150 μm. A clearance 503 is formed between the ground conductor 501 and the via hole metal pad 502 and has an outer diameter of 500 μm.

As shown in FIG. 9, the third circuit layer 23 is provided with a microstrip line 601 and a via hole metal pad 602. The microstrip line 601 has a width of 100 μm and serves as a signal transmission line. The via hole metal pad 602 is 160 μm in length and width, provided around the via hole 410 and connected to one end of the microstrip line 601.

A planar impedance matching circuit is constructed of the impedance matching microstrip lines 404 and 405. A via hole connecting portion is constructed of the via hole 410, via hole metal pad 402, via hole metal pad 502, via hole metal pad 602 and impedance matching microstrip lines 404 and 405.

In the high-frequency multilayer circuit substrate of the above-mentioned construction, the characteristic impedance of the via hole connecting portion is controlled by adjusting length and width of the impedance matching microstrip lines 404 and 405, by which the characteristic impedance of the via hole connecting portion can be matched to the characteristic impedance of the transmission line at a wavelength of a signal to be transmitted.

Figure 10:
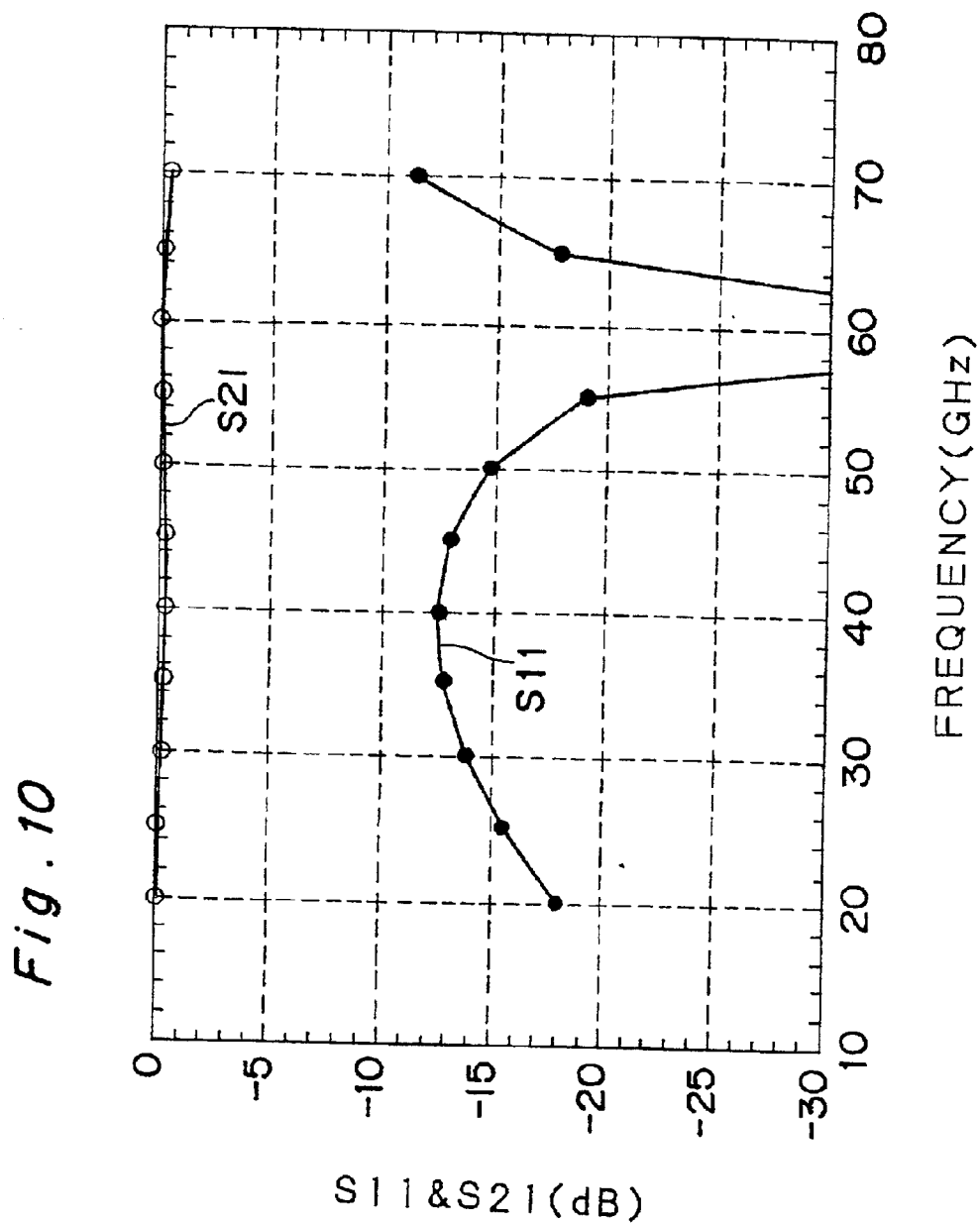
FIG. 10 is an inter-circuit-layer transmission characteristic of the high-frequency multilayer circuit substrate according to the second embodiment.

As a result of optimization executed by using the same method as that in the first embodiment, a low-loss transmission characteristic has been obtained on condition that the length of the impedance matching microstrip line 404 having a width of 180 μm is 450 μm and the length of the impedance matching microstrip line 404 having a width of 100 μm was 450 μm. FIG. 10 shows the high-frequency transmission characteristic in the above case. FIG. 10 shows the decibel value of reflection loss (S11) and the decibel value of transmission loss (S21). The horizontal axis represents the frequency, while the vertical axis represents the reflection loss and the transmission loss.

As is apparent from FIG. 10, low-reflection low-loss inter-circuit-layer transmission at a frequency of 60 GHz can be achieved with a simple structure employing the high-frequency multilayer circuit substrate of this second embodiment.

In the aforementioned first and second embodiments, the two signal transmission lines connected by way of the via hole are respectively arranged in the circuit layers located on both sides of the ground conductor layer. However, it is possible to arrange the two signal transmission lines connected by way of the via hole in the circuit layers located on an identical side with respect to the ground conductor layer.

Although the microstrip line is employed for the signal transmission line in the aforementioned first and second embodiments, the same effects can be obtained even when a coplanar line or a strip line is used.

Furthermore, in the aforementioned first and second embodiments, the characteristic impedance of the via hole connecting portion is matched to the characteristic impedance of the microstrip transmission line to which the via hole connecting portion is connected and which is served as the signal transmission line. However, it is acceptable to match the characteristic impedance of the via hole connecting portion with the characteristic impedance of a planar circuit that is connected directly to the via hole connecting portion through no signal transmission line.

As is apparent from the above, according to the high-frequency multilayer circuit substrate of the present invention, the characteristic impedance of the via hole connecting portion, which is constructed of the via hole and the planar circuit, can be matched to the characteristic impedance of the transmission line with a simple structure in terms of design and manufacturing. As a result, low-reflection low-loss inter-circuit-layer transmission in a microwave region, particularly in the millimeter wave region, can be achieved with a simple structure, allowing the manufacturing cost to be reduced. Furthermore, this high-frequency multilayer circuit substrate can be effectively utilized for the development of circuits and packages in the microwave region, particularly in the millimeter wave region.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A high-frequency multilayer circuit substrate comprising:

at least three circuit layers, an inner circuit layer of which includes a ground conductor;

a via hole penetrating the plurality of circuit layers to be connected to each other;

a via hole metal pad provided around the via hole;

a planar impedance matching circuit connected to the via hole through the via hole metal pad; and a microstrip line being a signal transmission line, formed in at least one of the circuit layers other than the inner circuit layer, connected to the planar impedance matching circuit, wherein a characteristic impedance of a via hole connecting portion formed by the via hole, the via hole metal pad and the planar impedance matching circuit matches a characteristic impedance of the signal transmission line, the planar impedance matching circuit includes an impedance matching microstrip line, one end of which is connected to the via hole through the via hole metal pad and other end of which is directly connected to the microstrip line being the signal transmission line, the via hole metal pad, the planar impedance matching circuit and the microstrip line being the signal transmission line are located on the same circuit layer.

2. A high-frequency multilayer circuit substrate as set forth in claim 1, wherein the characteristic impedance of the via hole connecting portion matches the characteristic impedance of the signal transmission line based on an adjusted width and length of the impedance matching microstrip line.

3. A high-frequency multilayer circuit substrate as set forth in claim 1, wherein
the planar impedance matching circuit is formed by the impedance matching microstrip line and stubs which are connected to both sides of the impedance matching microstrip line at the other end connected to the microstrip being the signal transmission line.

4. A high-frequency multilayer circuit substrate as set forth in claim 3, wherein
the characteristic impedance of the via hole connecting portion matches the characteristic impedance of the microstrip line being the signal transmission line based on an adjusted width and length of the impedance matching microstrip line and a width and a length of each of the stubs.

5. A high-frequency multilayer circuit substrate as set forth in claim 1, wherein
the planar impedance matching circuit is formed by a plurality of impedance matching microstrip lines having at least two different widths and connected in series to the via hole and the microstrip line being the signal transmission line.

6. A high-frequency multilayer circuit substrate as set forth in claim 5, wherein
the characteristic impedance of the via hole connecting portion matches the characteristic impedance of the microstrip line being the signal transmission line based on adjusted widths and lengths of the impedance matching microstrip lines.

* * * * *